United States Patent
Adler et al.

(10) Patent No.: US 7,302,376 B2
(45) Date of Patent: Nov. 27, 2007

(54) DEVICE MODELING FOR PROXIMITY EFFECTS

(75) Inventors: Eric Adler, Jericho, VT (US); Serge Biesemans, Mount Kisco, NY (US); Micah S. Galland, Essex Junction, VT (US); Terence B. Hook, Jericho, VT (US); Judith H. McCullen, Essex Junction, VT (US); Eric S. Phipps, Winston-Salem, NC (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 740 days.

(21) Appl. No.: 10/248,853

(22) Filed: Feb. 25, 2003

(65) Prior Publication Data

US 2004/0034517 A1 Feb. 19, 2004

Related U.S. Application Data

(60) Provisional application No. 60/403,709, filed on Aug. 15, 2002.

(51) Int. Cl.
*G06F 17/50* (2006.01)
(52) U.S. Cl. ........................................ 703/14
(58) Field of Classification Search .................. 703/14
See application file for complete search history.

(56) References Cited

U.S. PATENT DOCUMENTS

| | | | | |
|---|---|---|---|---|
| 6,051,027 A | * | 4/2000 | Kapur et al. | 703/5 |
| 6,438,733 B1 | * | 8/2002 | Clement | 716/4 |
| 6,578,179 B2 | * | 6/2003 | Shirotori et al. | 716/3 |
| 6,898,561 B1 | * | 5/2005 | Liu et al. | 703/14 |
| 6,934,669 B1 | * | 8/2005 | Suaya et al. | 703/14 |
| 2003/0069722 A1 | * | 4/2003 | Beattie et al. | 703/14 |

FOREIGN PATENT DOCUMENTS

| | | |
|---|---|---|
| JP | 61160975 A | 7/1986 |
| JP | 62291070 A | 12/1987 |

OTHER PUBLICATIONS

Kuntal Joardar et al.; "An Improved MOSFET Model for Circuit Simulation", Jan. 1998, IEEE Transactions on Electron Devices, vol. 45, No. 1, pp. 134-148.*

(Continued)

*Primary Examiner*—Paul Rodriguez
*Assistant Examiner*—Russ Guill
(74) *Attorney, Agent, or Firm*—Anthony J. Canale (57) ABSTRACT

A method for calibrating a software model for a given structure of interest for a variable imposed by an adjacent structure. First determine the spatial extent of the variable imposed by the adjacent structure. Then assign a value to the spatial extent, which varies as a function of distance from the adjacent structure to the given structure. Finally, attach that value to the model of the given structure.

1 Claim, 6 Drawing Sheets

OTHER PUBLICATIONS

Terence B. Hook et al.; "Lateral Ion Implant Straggle and Mask Proximity Effect", 2003, IEEE Transactions on Electron Devices, vol. 50, No. 9, pp. 1946-1951.*

P.G. Drennan et al.; "Implications of Proximity Effects for Analog Design", 2006, IEEE Custom Integrated Circuits Conferece, eight unnumbered pages.*

Mohan V. Dunga et al.; "BSIM 4.6.0 MOSFET Model User's Manual", 2006, UC Berkeley, pp. 14-2 and 14-2.*

A. Roncaglis et al.; "A Unified Approach to Compact Modeling of Power and Logic Devices in Low-Cost nMOS-Based Smart Power Technology", Mar. 2002, 17th Annual IEEE Applied Power Electronics Conference and Exposition, pp. 446-451.*

J.L. Mauer IV, "Correcting The Proximity Effect Using Shaped Current Profiles For Electron Probe", IBM Technical Disclosure Bulletin, vol. 20, No. 8, Jan. 1978.

Ashton et al., "Fast, Accurate Proximity Correction Algorithm for 0.25 um Electron-Beam Lithography", IBM Technical Disclosure Bulletin, vol. 33, No. 10B, Mar. 1991.

van Dort, et al., "Influence of High Substate Doping Levels, n the Threshold Voltage and the Mobility f Deep-Submicrometer MOSFET's", IEEE Transactions n Electron Devices, vol. 39, No. 4, Apr. 1992, pp. 932-938.

Williams, et al., "A Compact Model Methodology for Device Design Uncertainty", 2003 R Gill Jul. 23, 2007 email: rqw@us.ibm.com, pp. 1-2.

Rim et al., Strained Si NMOSFETs for High Performance CMOS Technology, 2001 Symposium on VLSI Technology Digest of Technical Papers, 4-89114-012-7/01, pp. 59-60.

* cited by examiner

DEVICE MODELING FOR PROXIMITY EFFECTS

BACKGROUND OF THE INVENTION

1. Field of the Invention

The present invention generally relates to device modeling and to an improved model that simulates proximity effects from adjacent structures.

2. Description of the Related Art

Today's fast-paced product development cycles necessitate that design tools such as device models that simulate the performance of integrated circuit structures be as accurate as possible. Simulator tools have been created that determine the device parametrics of a given integrated circuit structure as a function of the process utilized to form it. See for example U.S. Pat. No. 5,761,481, "Semiconductor Simulator Tool for Experimental N-Channel Transistor Modeling" and "Influence of High Substrate Doping Levels on the Threshold Voltage and the Mobility of Deep-Submicrometer MOSFET's," 1992 IEEE Transactions on Electron Devices, Vol. 39, No. 4, pp. 932-938. This is particularly true for compact models (e.g., the physics-based subroutines used in numerical simulation codes for larger entities such as circuits, mechanical systems, etc.). To create accurate compact models, measured data are needed from hardware to calibrate the model. Compact models are further discussed and described in patent application Ser. No. 10/023,235, "System and Method For Target-Based Compact Modeling" filed Jan. 7, 2002 and assigned to the assignee of the present invention.

In the art, it is known that "proximity effects" can alter one or more parameters of integrated circuit structures that are adjacent (in "proximity") to one another. Examples of three different types of proximity effects are described below.

A first proximity effect is the lateral scattering of implanted dopants from a masking image placed nearby the feature of interest. A specific example is the formation of the implanted well regions for CMOS devices. When a well is implanted during manufacturing, implanted ions are scattered laterally across the wafer surface. This unwanted doping can be detected as far from the mask edge as two microns. Design rules allow for FETs to be placed well within this affected area and the result is a FET with a substantially altered threshold of voltage (Vt). Depending on the proximity, the Vt can be altered by as much as 100 mV. This effect can cause performance problems and in worst case scenarios, circuit failure. See e.g. U.S. patent application Ser. No. 10/063,406, entitled "Method of Forming Retrograde N-Well and P-Well", filed Apr. 19, 2002 and assigned to the assignee of the present invention, for a further discussion of this problem.

A second proximity effect is the proximity of an FET to an isolation edge (such as an edge of a shallow trench isolation, or STI), which can modify the strain (and hence mobility of carriers) in the portion of substrate that provides the channel of the FET. See for example Frim et al, "Strained Si NMOSFETs for High Performance CMOS Technology," 2001 Symposium on VLSI Technology Digest of Technical Papers, 5B-4, page 59.

A third proximity effect is the differential in integrity of the depth of focus (DOF) of an image printed by a photo-exposure tool between a pattern of structures that are wider apart and a pattern of structures that are closer together. Typically this problem is corrected by adding serifs or other sub-resolution "dummy" structures to the photomask. See for example U.S. Pat. No. 5,447,810, "Masks for Improved Lithographic Patterning for Off-Axis Illumination Lithography," and U.S. Pat. No. 5,821,014, "Optical Proximity Correction Method For Intermediate-Pitch Features Using Sub-Resolution Scattering Bars on a Mask."

The foregoing and other proximity effects will only become more pervasive as circuit groundrules continue to shrink. A need exists in the art to develop a device modeling and simulation methodology that takes these and other proximity effects into account.

SUMMARY OF THE INVENTION

In view of the foregoing and other problems, disadvantages, and drawbacks of the conventional modeling systems, the present invention has been devised, and it is an object of the present invention to provide a structure and method for an improved modeling system.

Accordingly, in a first aspect the invention comprises programmable storage device having a computer readable program stored thereon executable by a computer to carry out a method of calibrating a software model for a given structure of interest for a variable imposed by an adjacent structure, comprising the steps of determining the spatial extent of the variable imposed by the adjacent structure; assigning a value to the spatial extent, which varies as a function of distance from the adjacent structure to the given structure; and attaching that value to the model of the given structure.

In a second aspect, the invention comprises a method for providing proximity effect information to a model of a given device structure, comprising the steps of determining a spatial extent and variation of the a given proximity effect produced by a proximity feature; determining a location and orientation of the modeled device relative to the proximity feature; generating a variable arising from the proximity effect that is assigned to a modeled parameter; and applying the variable to the device model.

In a third aspect, the invention is a method of calibrating a software model for a given structure of interest for a variable imposed by a proximity feature, comprising the steps of creating a model for the proximity feature, the model being segmented with a proximity value assigned to each segment; determining an area of the given structure within each segment of the model for the proximity feature; assigning a proximity value to each area of the given structure within each segment; integrating the proximity values for each area across the total area of the given structure; and applying the integrated shift parameter to the software model.

DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

In the description to follow, reference will be made to "devices" and "products". In the preferred embodiment, "device" refers to an active or passive integrated circuit component, such as a transistor, capacitor, resistor, or the like (most preferably, it refers to a transistor), and "product" refers to the overall integrated circuit chip. However, it is to be understood that the invention is also applicable to any component of any product, where the performance attributes of that component may be varied by proximity effects.

The invention is applicable to situations in which the performance attributes of the device are in turn dependent on the manufacturing process by which it is made. That is, the manufacturing process can be developed to optimize certain "performance parameters" of the device; it is these parameters that can be varied by the above-noted and other proximity effects. An example of a "performance parameter" is the threshold voltage (Vt) of a transistor.

Figure 1:
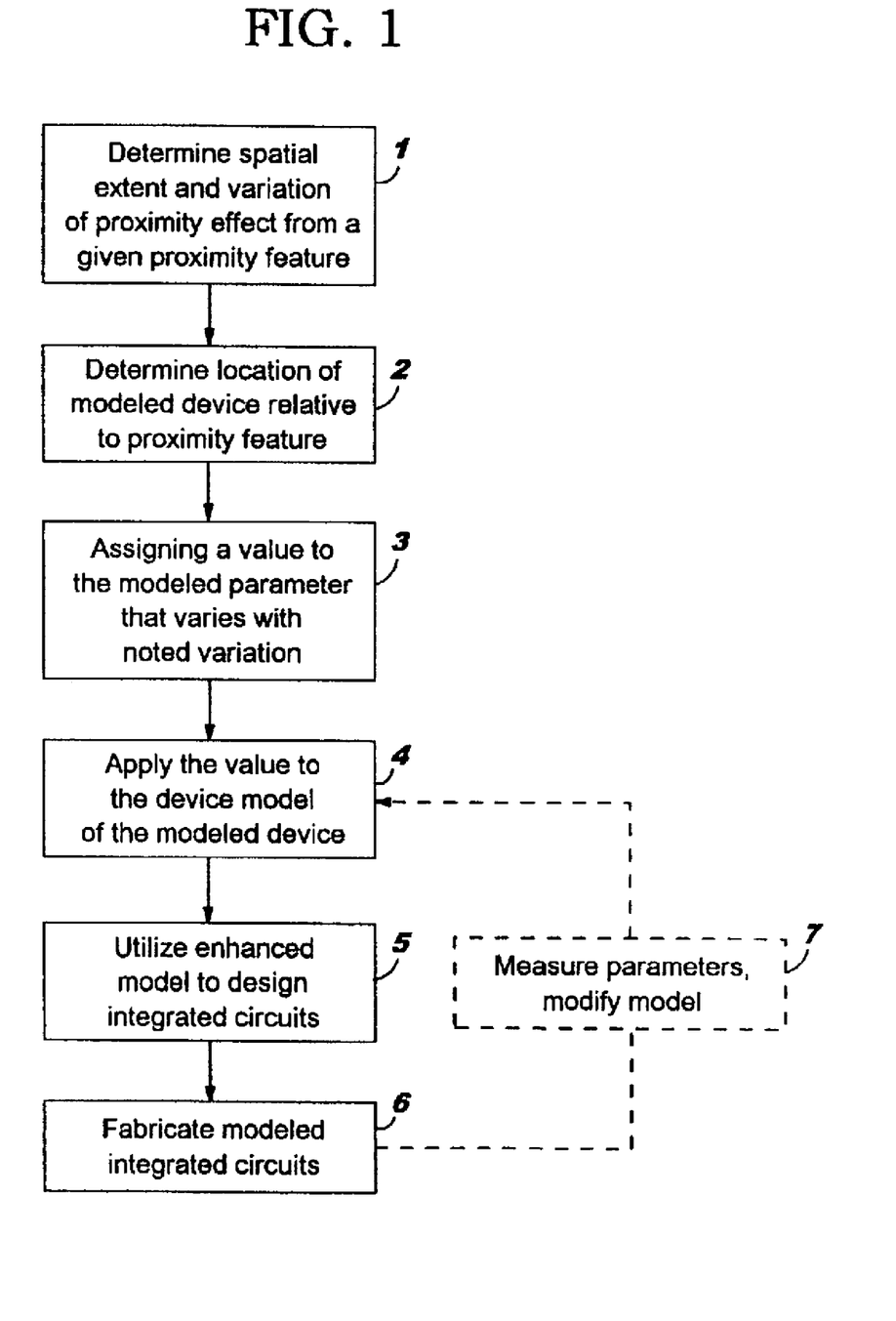
FIG. 1 is a flowchart of the method in accordance with a first embodiment of the invention.

With reference to FIG. 1, a first general embodiment of the invention will be described. In the description to follow, the structure that causes the proximity effect or which manifests that effect will be referred to as the "proximity feature", and the device that we wish to model will be referred to as the "modeled device". The particular performance parameter of the modeled device that varies as a function of the proximity effect in question will be referred to as the "modeled parameter". The embodiment of FIG. 1 will be described with reference to the first proximity effect described above (dopant scattering during well implantation). So in our example the "proximity feature" will be the well mask edge, the "modeled device" will be an FET adjacent the well, and the "modeled parameter" will be the Vt of the modeled device. It is to be understood that the present invention is applicable to the modeling of other proximity effects, including but not limited, to the isolation edge and DOF effects discussed previously.

First, in step 1 a determination is made of the spatial extent and variation of the given proximity effect produced by the proximity feature. This determination can be based on the technical literature or through hardware examination (the latter being preferable, since these effects typically vary from process to process, as a function of both groundrules and processing parameters). In this case it has been determined that the dopant scattering effect raises the Vt of the FETs the closer the device is to the mask edge. As distance from the mask edge is increased past several microns or so, Vt falls to nominal values. Then, in step 2 we determine the location and orientation the modeled device relative to the proximity feature. For example, if the gate of the FET is perpendicular to (and within several microns of) the well edge, the end proximal to the well edge will have a higher Vt than the end most distal to the well edge.

Then in step 3 the results of the first two determinations are combined to generate a variable (arising from the proximity effect) that is assigned to the modeled parameter. In other words, knowing how the proximity effect varies threshold voltage in adjacent FETs, and knowing the distance and orientation of a given FET to the well, a variable can be created that indicates the effect on the Vt of the given FET due to the proximity feature. Note that these first three steps 1-3 are typically carried out using a design tool referred to as a geometry extractor, or simply an "extractor".

An extractor creates variables or values that are inserted to a device model, as described below. Examples of commercially available extractors include the "Maverick" tool available from Silvaco and the "Assura RCX" tool available from Cadence Design Systems.

Then, in step 4 this variable is applied to the device model (for example, a compact model) for the modeled device. The device model here could be commercially available device modeling software; in the invention the preferred models are PWRSPICE or HSPICE. In step 5 the resulting device model is used by the circuit designer along with other conventional software and hardware tools to design an integrated circuit, and in step 6 the design is fabricated into integrated circuit chips using currently available semiconductor manufacturing processes. Finally, if a compact model is being used, in step 7 the model may be upgraded as a function of measurements taken of process parameters of the fabricated integrated circuit chips (note, this step is optional, as indicated by the dashed lines). When using compact models, at the beginning of a new process technology (e.g., a new ULSI chip fabrication process generation), a compact model (the target model) is created for a device such as a metal-oxide semiconductor field-effect transistor (MOSFET) that reflects the process performance targets that are to be achieved at the end of the process development cycle. The model is typically based on extrapolation using an existing compact model from a previous process technology; as products are fabricated, these extrapolations can be corrected.

As a result, the invention enables the device model to reflect the variation in the performance of the modeled device due to the variation in the modeled parameter induced by the proximity feature. Therefore the device model becomes a more accurate reflection of the performance of the resulting integrated circuit chip, facilitating circuit design in step 5 and increasing yields in step 6.

Figure 2:
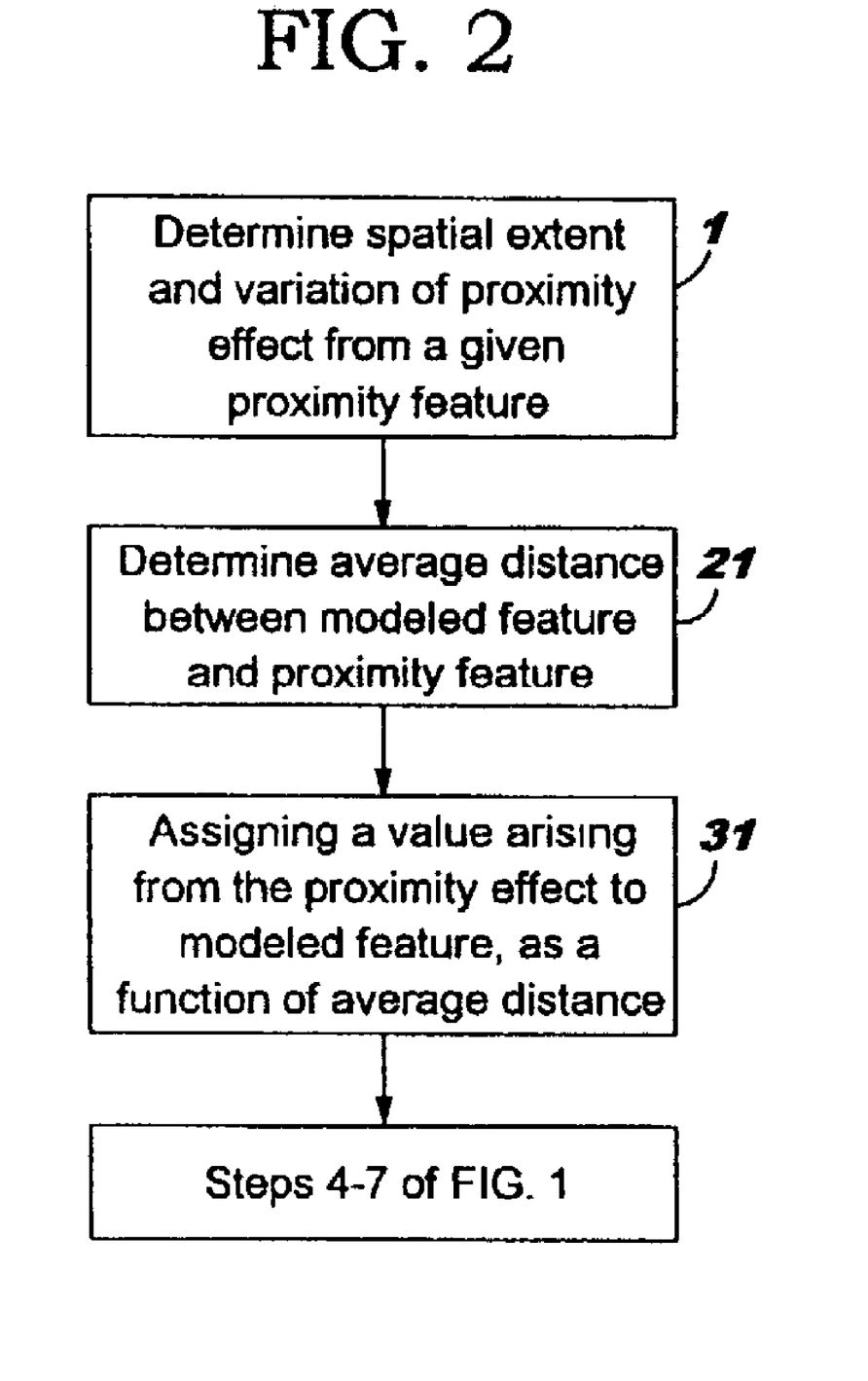
FIG. 2 is a flowchart of the method in accordance with a second embodiment of the invention.
Figure 3:
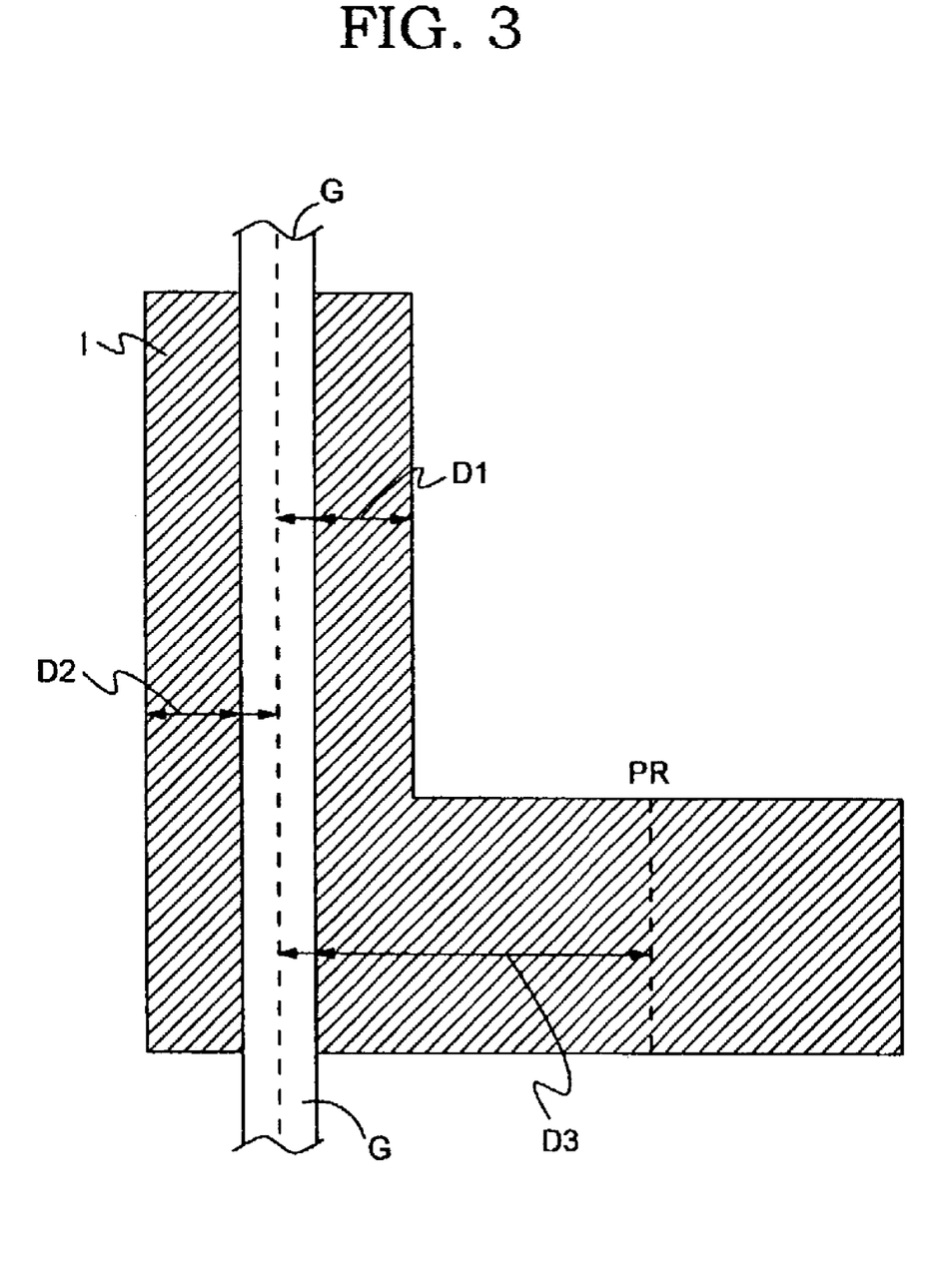
FIG. 3 is a top view of a proximity feature and a modeled feature illustrating step 21 of the method of FIG. 2.

A second embodiment of the invention will be described with reference to FIG. 2. The first step in the process is the same as in FIG. 1. Then, in step 21 we determine the average distance between the edge of the modeled device and the edge of the proximity feature. That is, instead of determining the real distance and relative orientation as we did in step 2 of FIG. 1, here we determine a single average distance (a set of distances that are then averaged). This technique works particularly well when the proximity feature and the modeled device overlap (e.g. when a gate overlaps an isolation region, and the proximity effect in question is the differential stress induced by the isolation region), and/or when either the proximity feature or the modeled device has a shape other than a single rectangle or square. FIG. 3 illustrates this step in more detail. The gate G of the modeled device overlaps an isolation region I. Note that region I has an L shape. In this step the respective distances D1 and D2 are measured from the edges of region I to the edges of gate G. As a practical matter, these measurements are taken from the isolation edge to the center of gate G, as indicated by the dashed line running down its center. Note that the distance D3 is taken from the center of gate G to the dashed line PR rather than to the far edge of isolation region I. This is because for the particular proximity effect in question, the spatial extent of the effect (or, the "proximity region" as indicated by the dashed line PR) does not exceed D3. In other words, for the particular proximity effect in question (here, stress-induced Vt shifts), the maximum distance between the structure causing the effect and the position of a device experiencing the effect is D3. These respective distances D1, D2, and D3 are then summed and averaged to derive a single, average distance.

Then, at step 31, the process of the invention assigns a value to the process parameter of the modeled feature, which reflects the proximity effect at this average distance. Note that because we developed an average distance this value is a single value, as opposed to the method of FIG. 1 where we created a variable (or set of values) that reflected the proximity effect. Then the process finishes with the same steps 4-7 as in the first embodiment. Again, the result is a model that more accurately reflects the performance of the modeled semiconductor manufacturing process.

Figure 4:
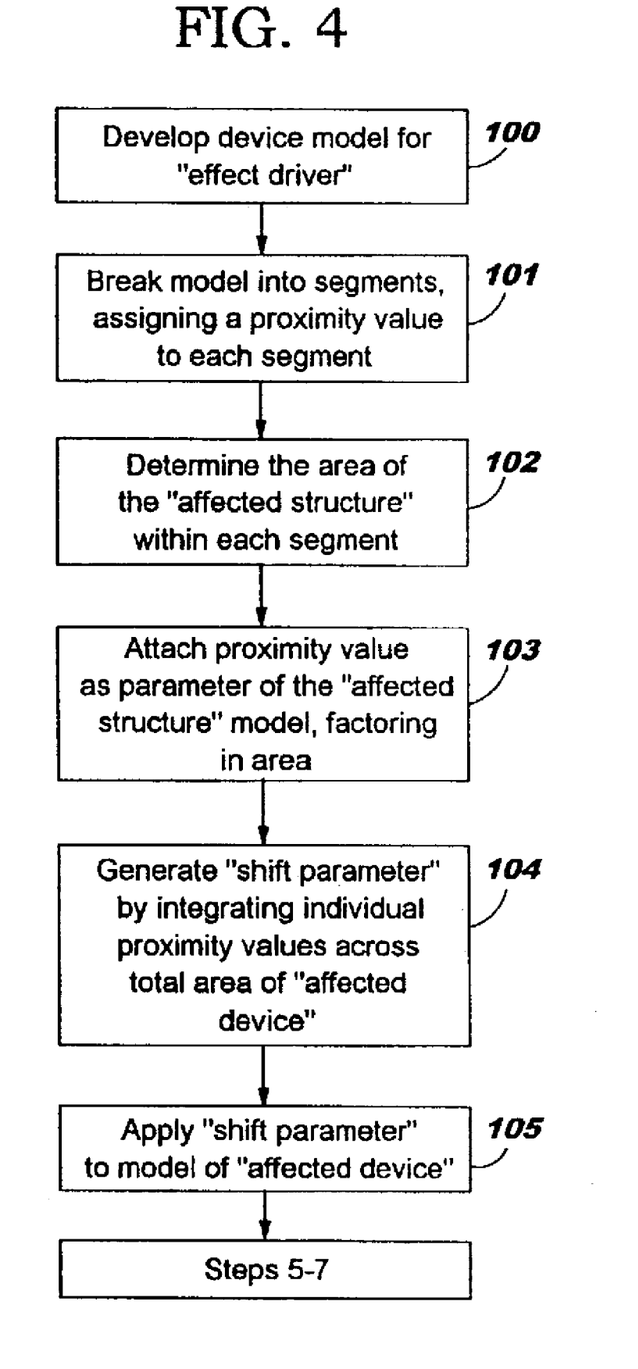
FIG. 4 is a flowchart of the method in accordance with a third embodiment of the invention.

The third embodiment of the invention will now be described with reference to FIGS. 4 and 5. In a first step 100 shown in FIG. 4, a device model is developed for the proximity feature. Again using the example of well mask edge induced Vt shifts, the model in question would be of the well. Note that in this embodiment rather than simply averaging the geometric shape of the proximity feature, the model would indicate the spatial extent of the proximity effect. In step 102 the well model is broken into predefined segments (regions A-D between the mask edge ME and the device features, gate G' and implant region I'), and a proximity value is assigned to each segment. The relative area of each segment may be constant, or it may vary as a function of the change in proximity effect within the proximity region. Thus, if the effect does not vary significantly within the proximity region, the model is broken up into two or three segments. As the effect varies more greatly, the relative area of the segments is made smaller. The invention addresses the situation in which the proximity effect varies relatively little for a given distance from the proximity feature, then drops off quickly above the given distance; in such a case the segments would be wide inside the given distance and more narrow beyond it. Then in step 102 the area of the device structures G', I' within each segment is determined. Note that these first three steps are typically carried out by the geometric extraction software tool.

In step 103 a proximity value is attached to each area of the modeled device within each segment, factoring in the assigned proximity value from step 101 and the amount of area in each segment determined from step 102. Then in step 104 a "shift parameter" is generated by integrating the individual proximity values across the total area of the modeled device, and in step 105 the integrated shift parameter is applied to the device model. Thus, the model can take these areas and produce a threshold voltage shift parameter by integrating a Vt shift function across the device area. Based on an understanding of the distribution of scattered dopants as a function of distance from the mask edge, an average Vt increase can be assigned to each of the area buckets identified above, which is then averaged across the channel area. Finally steps 5-7 of FIG. 1 can be carried out. Note that steps 103-105 are carried out using the HSPICE or PWRSPICE device modeling software.

Figure 5:
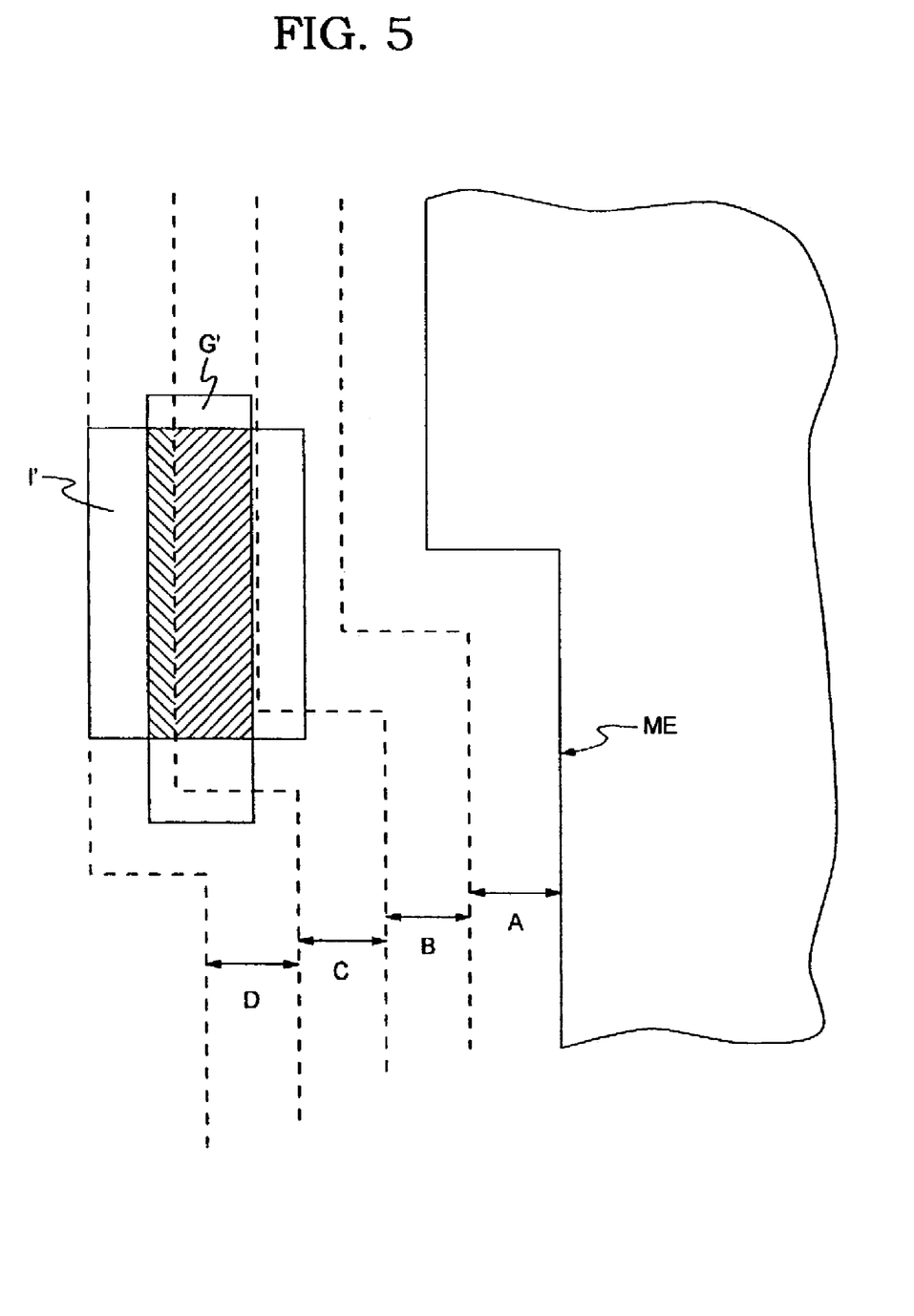
FIG. 5 is a top view of a proximity feature and a modeled feature illustrating steps 101 and 102 of FIG. 4.
Figure 6:
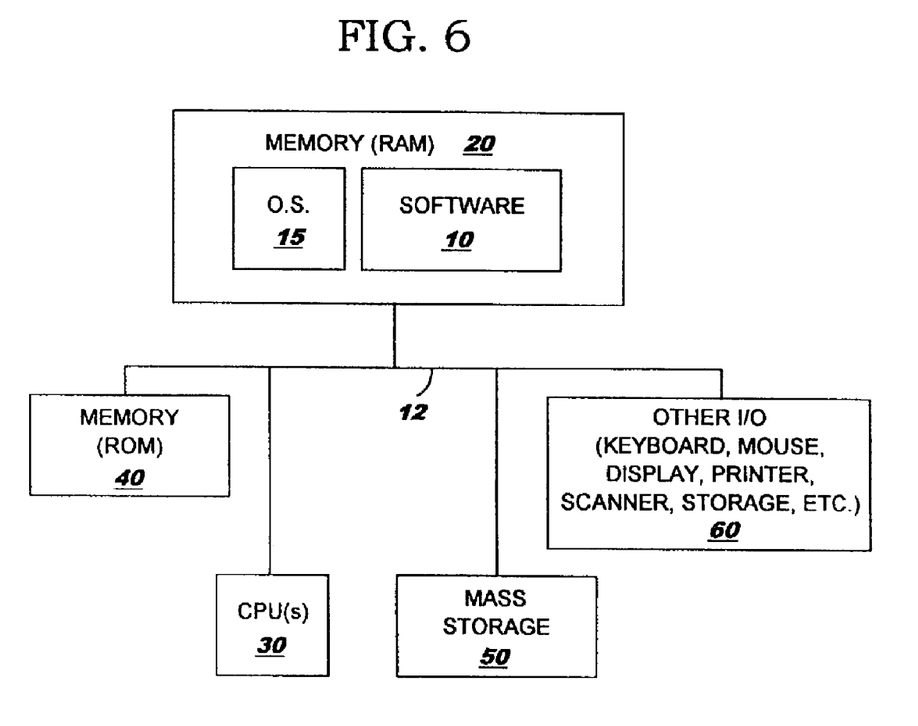
FIG. 6 is a hardware embodiment in which the invention is carried out.

A representative hardware environment for practicing the present invention is depicted in FIG. 5, which illustrates a typical hardware configuration of an information handling/computer system in accordance with the subject invention, having at least one processor or central processing unit (CPU) 30. CPUs 30 are interconnected via system bus 12 to random access memory (RAM) 20, read-only memory (ROM) 40, an input/output (I/O) adapter 60 for connecting peripheral devices, a keyboard, mouse, display, or printer, and to mass storage 50 having disk units and/or tape drives. The invention as embodied in software is stored on a program storage device readable by the disk or tape units 50. The software instructions of the invention are read into area 10 of RAM storage 20, and are processed by the CPU(s) 30 under the control of the operating system software OS 15.

While the invention has been described in terms of preferred embodiments, those skilled in the art will recognize that the invention can be practiced with modification within the spirit and scope of the appended claims.

What is claimed is:

1. A programmable storage device having a computer readable program stored thereon executable by a computer to carry out a method of calibrating a software model for a given integrated circuit structure, comprising the steps of:

determining an average distance between the center of the given integrated circuit structure and an edge of a proximity feature, if the edge of a proximity region is closer to the center of the given integrated circuit structure than is the edge of the proximity feature then the average distance is determined between the center of the given integrated circuit structure and the edge of the proximity region;

assigning a value to a process parameter of the given integrated circuit structure, which reflects a proximity effect at this average distance;

attaching the assigned value to a model of the given integrated circuit structure; and outputting the model for utilization in creating an integrated circuit design.

* * * * *